(12) United States Patent
Zhang et al.

(10) Patent No.: US 10,767,833 B2
(45) Date of Patent: Sep. 8, 2020

(54) OPTICAL DEVICE, METHOD FOR MANUFACTURING SAME, AND DISPLAY DEVICE

(71) Applicants: HEFEI BOE OPTOELECTRONICS TECHNOLOGY CO., LTD., Hefei, Anhui (CN); BOE TECHNOLOGY GROUP CO., LTD., Beijing (CN)

(72) Inventors: Bing Zhang, Beijing (CN); Xiaolin Geng, Beijing (CN); Liang Gao, Beijing (CN); Jianwei Qin, Beijing (CN); Hai Tang, Beijing (CN); Lu Gao, Beijing (CN); Jingbin Jie, Beijing (CN); Bo Han, Beijing (CN)

(73) Assignees: HEFEI BOE OPTOELECTRONICS TECHNOLOGY CO, LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/390,430

(22) Filed: Apr. 22, 2019

(65) Prior Publication Data

US 2020/0056757 A1      Feb. 20, 2020

(30) Foreign Application Priority Data

Aug. 16, 2018      (CN) .......................... 2018 1 0935385

(51) Int. Cl.
*F21V 3/08*      (2018.01)
*F21V 9/32*      (2018.01)
(Continued)

(52) U.S. Cl.
CPC .................. *F21V 3/08* (2018.02); *F21V 9/32* (2018.02); *H01L 25/0753* (2013.01); *F21Y 2115/10* (2016.08)

(58) Field of Classification Search
CPC ........ F21V 9/32; F21V 13/14; H01L 25/0753; H01L 33/505; H01L 33/58; H01L 27/156;
(Continued)

(56) References Cited

U.S. PATENT DOCUMENTS

| 8,110,839 B2* | 2/2012 | Ing ..................... G02F 1/133611 |
| | | 257/89 |
| 9,746,157 B2* | 8/2017 | Ninan ..................... H01L 51/56 |

(Continued)

FOREIGN PATENT DOCUMENTS

| CN | 102980136 A | 3/2013 |
| CN | 103235352 A | 8/2013 |

(Continued)

OTHER PUBLICATIONS

First Office Action for Chinese Application No. 201810935385.9, dated Mar. 17, 2020, 8 Pages.

*Primary Examiner* — Peggy A Neils
(74) *Attorney, Agent, or Firm* — Brooks Kushman P.C.

(57) ABSTRACT

Provided is an optical device, a method for manufacturing the same, and a display device. The optical device includes a chip substrate and a quantum dot film. The quantum dot film includes a quantum dot functional layer, a first package substrate, a second package substrate, and a prism structure and/or a uniform-light diffusing film.

20 Claims, 2 Drawing Sheets

(51) Int. Cl.
*H01L 25/075* (2006.01)
*F21Y 115/10* (2016.01)

(58) Field of Classification Search
CPC .... H01L 33/504; H01L 33/60; F21Y 2115/10; F21Y 2105/10; F21K 9/64; G02F 1/133555; G02F 1/133603; G02F 1/133605; G02F 1/133606; G02F 2001/133607; G02F 1/133609; G02F 2001/133614

See application file for complete search history.

(56) References Cited

U.S. PATENT DOCUMENTS

| | | | |
|---|---|---|---|
| 10,539,297 B2* | 1/2020 | Miller | C09K 11/7492 |
| 2006/0077691 A1* | 4/2006 | Kim | G02B 6/0051 |
| | | | 362/617 |
| 2006/0245208 A1* | 11/2006 | Sakamoto | G02F 1/133603 |
| | | | 362/612 |
| 2017/0168351 A1 | 6/2017 | Qiu et al. | |
| 2019/0041698 A1* | 2/2019 | Lin | G02F 1/133621 |
| 2019/0094619 A1* | 3/2019 | Park | H01L 25/13 |
| 2019/0187514 A1* | 6/2019 | Kuniyasu | F21S 2/00 |
| 2019/0258098 A1* | 8/2019 | Oba | G02B 5/20 |
| 2019/0285944 A1* | 9/2019 | Liu | H05K 3/3494 |

FOREIGN PATENT DOCUMENTS

| | | |
|---|---|---|
| CN | 104154468 A | 11/2014 |
| CN | 105676532 A | 6/2016 |

* cited by examiner

OPTICAL DEVICE, METHOD FOR MANUFACTURING SAME, AND DISPLAY DEVICE

CROSS-REFERENCE TO RELATED APPLICATION

This application claims priority to Chinese Patent Application No. 201810935385.9 filed on Aug. 16, 2018, which is incorporated herein by reference in its entirety.

TECHNICAL FIELD

The present disclosure relates to the field of display technology, in particular to an optical device, a method for manufacturing the same, and a display device.

BACKGROUND

A Mini LED (Mini Organic Light-Emitting Diode) is based on tiny LED crystal particles as pixel light-emitting points. When used as a surface light source for display devices, it can achieve high contrast, high brightness, and high color gamut. Moreover, HDR (High-Dynamic Range) effect can be achieved by partitioning the surface light source.

In the case of using the Mini LED as a surface light source for a display device, it is common to adopt a direct-type configuration in which a quantum dot (QD) film is arranged above a chip substrate of the Mini LED surface light source. The light mixing principle of the Mini LED surface light source lies in that the Mini LED chip emits blue light which is mixed with red and green light emitted by the excitation of the QD film to form white light. The QD film mainly includes a quantum dot functional layer, which requires high water and oxygen isolation and is sealed by two layers, i.e., upper and lower package layers.

The upper layer of the traditional QD film needs to be separately provided with a prism sheet to achieve light gathering, and the lower layer needs to be separately provided with a diffusing film, so as to improve the brightness uniformity of the Mini LED surface light source. In this way, the entire optical device has a complicated overall modular structure with a relatively large thickness.

SUMMARY

The present disclosure provides the following technical solutions.

According to some embodiments of the present disclosure, there is provided an optical device that includes: a chip substrate having a first face on which a plurality of light-emitting chips for emitting blue light is distributed in an array; and a quantum dot film arranged on a side of the chip substrate where the first face is located and configured to convert the blue light emitted by the plurality of light-emitting chips into monochromatic light in various colors capable of being mixed into white light, in which the quantum dot film includes: a quantum dot functional layer, a first package substrate arranged on a side of the quantum dot functional layer away from the chip substrate and including a first side surface away from the quantum dot functional layer and a second side surface arranged opposite to the first side surface, and a second package substrate arranged on a side of the quantum dot functional layer proximate to the chip substrate, and including a third side surface away from the quantum dot functional layer and a fourth side surface arranged opposite to the third side surface.

The quantum dot film further includes at least one of: a prism structure integrated on the first side surface of the first package substrate with the first package substrate as a base substrate; and a uniform-light diffusing film integrated on the third side surface of the second package substrate with the second package substrate as a base substrate.

Optionally, the quantum dot film further includes: a first isolation protective layer arranged on the second side surface of the first package substrate; and a second isolation protective layer arranged on the fourth side surface of the second package substrate.

Optionally, the uniform-light diffusing film includes a transflective film that includes: a plurality of reflective regions configured to reflect the blue light; and a transmissive region configured to allow the blue light to pass therethrough, in which the plurality of reflective regions is distributed in an array on the second package substrate, and orthogonal projections of the plurality of reflective regions on the first face of the chip substrate completely coincide with the plurality of light-emitting chips, respectively.

Optionally, a highly-reflective layer is arranged on a region of the first face of the chip substrate, on which none of the plurality of light-emitting chips is arranged.

Optionally, the highly-reflective layer is a white-light-highly-reflective layer having a reflectivity for white light greater than a preset value.

Optionally, the white-light-highly-reflective layer includes a composite film layer of a tantalum pentoxide film layer and a silicon dioxide film layer, a silver plated film layer or an aluminum plated film layer.

According to some other embodiments of the present disclosure, there is provided a method for manufacturing an optical device, which method includes: providing a first package substrate including a first side surface and a second side surface arranged opposite to each other and a second package substrate including a third side surface and a fourth side surface disposed opposite to each other; bonding the second side surface of the first package substrate and the fourth side surface of the second package substrate by applying a quantum dot functional layer between the first package substrate and the second package substrate to form a quantum dot film after the quantum dot functional layer has been cured; forming a chip substrate having a first face on which a plurality of light-emitting chips for emitting blue light is distributed in an array; and arranging the quantum dot film on a side of the chip substrate where the first face is located. The providing the first package substrate and the second package substrate includes at least one of: forming a prism structure on the first side surface of the first package substrate with the first package substrate as a base substrate, and forming a uniform-light diffusing film on the third side surface of the second package substrate with the second package substrate as a base substrate.

Optionally, the forming the prism structure on the first side surface of the first package substrate with the first package substrate as a base substrate includes: forming the prism structure on the first side surface of the first package substrate with the first package substrate as a base substrate through a rolling method.

Optionally, the forming the uniform-light diffusing film on the third side surface of the second package substrate with the second package substrate as the base substrate includes: plating reflective films on the third side surface of the second package substrate at positions corresponding to the plurality of reflective regions of the transflective film by an ion beam sputter coating method, to form the transflective film.

Optionally, prior to bonding the second side surface of the first package substrate and the fourth side surface of the second package substrate, the method further includes: forming a first isolation protective layer on the second side surface of the first package substrate by an ion beam sputter coating method; and forming a second isolation protective layer on the fourth side surface of the second package substrate by an ion beam sputter coating method.

Optionally, the forming the chip substrate includes: forming a highly-reflective layer on a region of the first face of the chip substrate, on which none of the plurality of light-emitting chips is arranged.

According to yet other embodiments of the present disclosure, there is provided a display device that includes the optical device as described above.

DETAILED DESCRIPTION

In order to make the objects, technical solutions and advantages of embodiments of the present disclosure more apparent, the technical solutions of the embodiments of the disclosure will be described clearly and completely with reference to the drawings of the embodiments of the present disclosure below. Apparently, the described embodiments merely relate to a part of, rather than all of, the embodiments of the present disclosure. Based on these embodiments, those skilled in the art may obtain the other embodiments which also fall within the protection scope of the present disclosure.

To solve the technical problem that the optical device provided with the Mini LED surface light source has a complicated overall modular structure with a relatively large thickness in the related art, embodiments of the present disclosure provide an optical device, a method for manufacturing the same, and a display device, which are capable of simplifying the structure of the optical device and reducing the thickness of the entire optical device.

Figure 1:
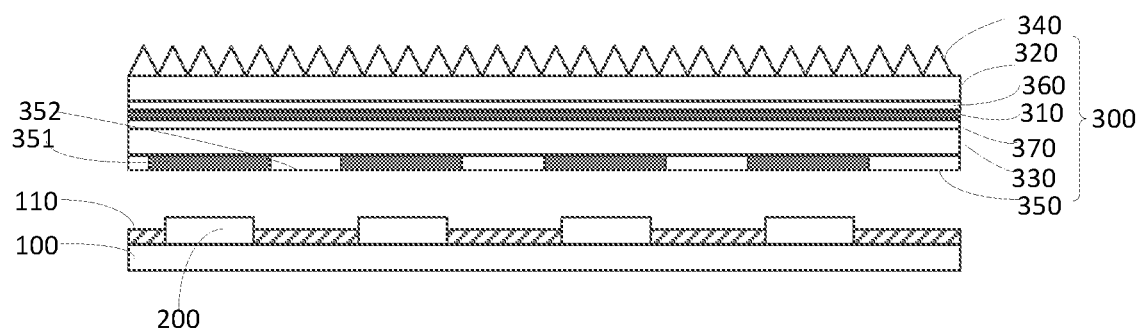
FIG. 1 is a schematic cross-sectional view showing an optical device provided in one embodiment of the present disclosure.
Figure 2:
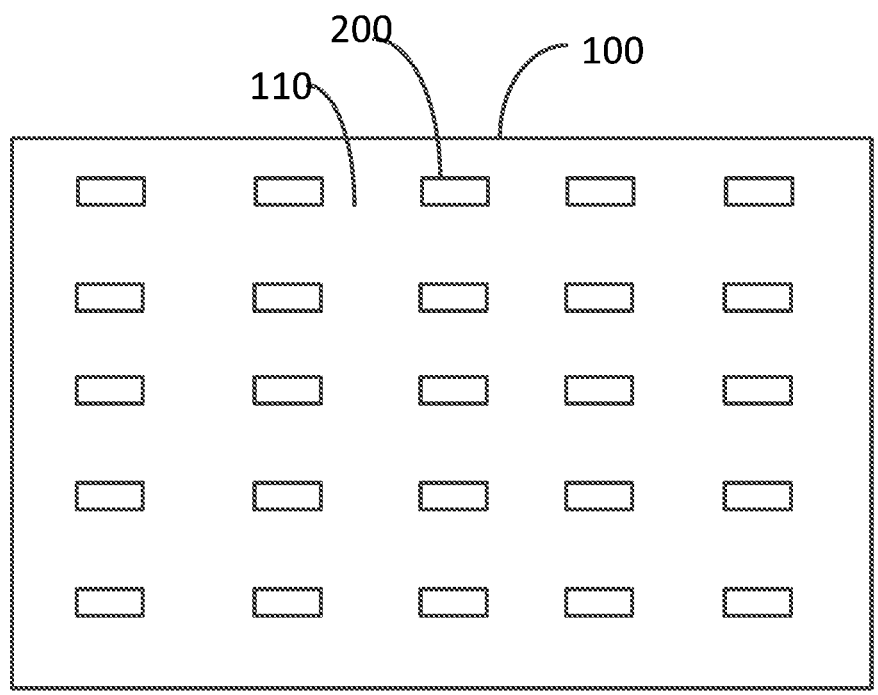
FIG. 2 is a top view of a first face of a chip substrate in the optical device provided in the embodiment of the present disclosure.

As shown in FIGS. 1 and 2, the optical device provided by an embodiment of the present disclosure includes: a chip substrate 100 having a first face on which a plurality of light-emitting chips 200 for emitting blue light is distributed in an array; and a quantum dot film 300 arranged on a side of the chip substrate 100 where the first face is located and configured to convert the blue light emitted by the plurality of light-emitting chips 200 into monochromatic light in various colors capable of being mixed into white light.

The quantum dot film 300 includes: a quantum dot functional layer 310, a first package substrate 320 arranged on a side of the quantum dot functional layer 310 away from the chip substrate 100 and including a first side surface away from the quantum dot functional layer 310 and a second side surface arranged opposite to the first side surface, and a second package substrate 330 arranged on a side of the quantum dot functional layer 310 proximate to the chip substrate 100, and including a third side surface away from the quantum dot functional layer 310 and a fourth side surface arranged opposite to the third side surface.

The quantum dot film 300 further includes: a prism structure 340 integrated on the first side surface of the first package substrate 320 with the first package substrate 320 as a base substrate; and a uniform-light diffusing film 350 integrated on the third side surface of the second package substrate 330 with the second package substrate 330 as a base substrate.

In the above solution, the first package substrate 320 of the quantum dot film 300 serves as the base substrate of the prism structure 340 and the prism structure 340 is directly produced on one side surface of the first package substrate 320, which enables the integration of the prism structure 340 and the quantum dot film 300; and/or, the second package substrate 330 of the quantum dot film 300 serves as the base substrate of the uniform-light diffusing film 350 and the uniform-light diffusing film 350 is directly produced on one side surface of the second package substrate 330, which enables the integration of the uniform-light diffusing film 350. By doing so, after the package of the quantum dot functional layer 310 by the first package substrate 320 and the second package substrate 330, it is possible to realize the integration of at least one of the prism structure 340 and the uniform-light diffusing film 350 and the quantum dot film 300. In contrast, in the technical solution of the related art, the prism sheet and the diffusing sheet are separately arranged on upper and lower layers of the quantum dot film 300, respectively, and the prism sheet and the diffusing sheet each require a separate substrate, and the structure formed by these components and two layers of package substrates on the quantum dot film is thus complicated and has a large modular thickness. However, the optical device provided in the embodiment of the present disclosure can lead to the omission of the base substrate of at least one of the prism sheet and the diffusing sheet, thereby simplifying the structure of the optical device and reducing the modular thickness of the optical device.

It should be noted that, in the foregoing solution, the light-emitting chip 200 may be a Mini LED (Mini Organic Light-Emitting Diode) chip, or may be a Micro LED (Micro Organic Light-Emitting Diode) chip or the like, and the optical device may be used as a surface light source of the display device.

In addition, in one embodiment of the optical device provided by the present disclosure, as shown in FIG. 1, the quantum dot film 300 further includes: a first isolation protective layer 360 arranged on the second side surface of the first package substrate 320, and a second isolation protective layer 370 arranged on the fourth side surface of the second package substrate 330.

With the above solution, the first isolation protective layer 360 may be provided on the second side surface of the first package substrate 320, that is, the first isolation protective layer 360 is arranged between the first package substrate 320 and the quantum dot functional layer 310 to achieve the isolation of the quantum dot functional layer 310. Moreover, the second isolation protective layer 370 may be provided on the fourth side surface of the second package substrate 330, that is, the second isolation protective layer 370 is arranged between the second package substrate 330 and the quantum dot functional layers 310 to achieve the isolation of the quantum dot functional layer 310.

It should be noted that, in the foregoing solution, the first package substrate 320 and the second package substrate 330 may each adopt a PET (polyethylene terephthalate) substrate, and the first isolation protective layer 360 and the second isolation protective layer 370 may be each a SiO$_2$ (silicon dioxide) layer, but these layers are not limited those described here.

For forming the prism structure 340 on the first side surface of the first package substrate 320 with the first package substrate 320 serving as the base substrate, a rolling method may be used to form the prism structure 340 on the first side surface of the first package substrate 320. An ion beam sputter coating method may be used to form the first isolation protective layer 360 on the second side surface of the first package substrate 320, and the ion beam sputter coating method may be also used to form the second isolation protective layer 370 on the fourth side surface of the second package substrate 330.

Furthermore, in an optional embodiment provided by the present disclosure, as shown in FIG. 1, the uniform-light diffusing film 350 includes a transflective film that includes: a plurality of reflective regions 351 configured to reflect the blue light; and a transmissive region 352 configured to allow the blue light to pass therethrough. The plurality of reflective regions 351 is distributed in an array on the second package substrate 330, and orthogonal projections of the plurality of reflective regions 351 on the first face of the chip substrate 100 completely coincide with the plurality of light-emitting chips 200, respectively.

As shown in FIG. 2, since the plurality of the light-emitting chips 200 is distributed in an array on the chip substrate 100, the brightness of light directly above the plurality of light-emitting chips 200 may be greater than that in peripheral regions of the plurality of light-emitting chips 200, and this will cause a problem of uneven distribution of light. However, with the above solution in which the transflective film serves as the uniform-light diffusing film, with regions directly facing the light-emitting chips 200 serving as the reflective regions 351 and regions corresponding to the peripheral regions of the light-emitting regions serving as the transmissive regions 352, the blue light is reflected in the regions directly above the light-emitting chips 200, but that blue light is transmitted in the peripheral regions of the light-emitting chips 200. As compared with the diffusing film used in the related art, the transflective film that is used in the present disclosure has a better property of homogenizing light and is able to effectively reduce the brightness of center points of the light-emitting chips 200, thereby achieving the light homogenizing effect without increasing the thickness.

It should be noted that the transflective film may be formed by plating reflective films on the third side surface of the second package substrate 330 at positions corresponding to the plurality of reflective regions 351 of the transflective film by an ion beam sputter coating method, to form the transflective film. The reflective film coated at the position corresponding to the reflective region 351 may be a silver plated film, an aluminum plated film or the like.

It will be understood that, in practical applications, the uniform-light diffusing film 350 may also be implemented by using other optical structure films which enable light homogenization and diffusion. For example, the uniform-light diffusing film 350 may include a light-transmissive film in which diffusion particles are doped to achieve the uniform-light diffusing effect. The implementation of the uniform-light diffusing film is not limited herein.

In addition, in an optional embodiment provided by the present disclosure, as shown in FIGS. 1 and 2, a highly-reflective layer is arranged on a region of the first face of the chip substrate 100, on which none of the plurality of light-emitting chips 200 is arranged. Optionally, the highly-reflective layer is a white-light-highly-reflective layer 110 having a reflectivity for white light greater than a preset value (e.g., reflectivity for white light is greater than 95%).

In the related art, the chip substrate of the Mini LED surface light source is coated with an ink reflective layer which has low reflectance for blue light and reflects only about 75% of the blue light, leading to a low light utilization rate, significant reduction of the excitation efficiency of the quantum dot film 300 and high power consumption. However, with the above solution of the present disclosure, the regions on the chip substrate 100 other than the light-emitting chips 200 is coated with the white-light-highly-reflective layer 110 which enables light emitted by the excitation of the quantum dot film 300 and reflected back to be reflected, thereby improving the light utilization and reducing the light loss. Further, as compared to the traditional ink reflective layer, the reflectivity for blue light can be increased by 25% to 30%, the light efficiency is improved by about 60% to 70%, and the reflectivity for white light is greater than 95%. According to experimental result, the light efficiency could be increased by 1.5 times when the white-light-highly-reflective layer 110 and the transflective film are used simultaneously.

The white-light-highly-reflective layer 110 may adopt a multilayer composite film layer of a tantalum pentoxide (Ta$_2$O$_5$) film layer and a silicon dioxide (SiO$_2$) film layer, which composite film layer may optionally have a thickness from 5 to 6 micrometers; or alternatively, the white-light-highly-reflective layer 110 may also be a silver plated film or an aluminum plated film, which may optionally have a thickness from 0.2 to 0.3 micrometers. The white-light-highly-reflective layer 110 may be formed by ion beam sputter coating in the process. Of course, it will be understood that, in practical applications, the white-light-highly-reflective layer 110 may also adopt other reflective films having a reflectivity for white light greater than a preset value.

In addition, in another aspect, embodiments of the present disclosure provide a method for manufacturing an optical device as provided by the above embodiments of the present disclosure. The method includes the following steps.

Step S1: providing a first package substrate 320 including a first side surface and a second side surface arranged opposite to each other and a second package substrate 330 including a third side surface and a fourth side surface disposed opposite to each other, forming a prism structure 340 on the first side surface of the first package substrate 320 with the first package substrate 320 as a base substrate, and/or forming a uniform-light diffusing film 350 on the third side surface of the second package substrate 330 with the second package substrate 330 as a base substrate.

Step S2: bonding the second side surface of the first package substrate 320 and the fourth side surface of the second package substrate 330 by applying a quantum dot functional layer 310 between the first package substrate 320 and the second package substrate 330 to form a quantum dot film 300 after the quantum dot functional layer 310 has been cured.

Step S3: forming the chip substrate 100.

Step S4: arranging the quantum dot film 300 on a side of the chip substrate 100 where the first face is located, to obtain the optical device.

In the above solution, the first package substrate 320 of the quantum dot film 300 serves as the base substrate of the prism structure 340 and the prism structure 340 is directly produced on one side surface of the first package substrate 320, which enables the integration of the prism structure 340 and the quantum dot film 300; and/or, the second package substrate 330 of the quantum dot film 300 serves as the base substrate of the uniform-light diffusing film 350 and the uniform-light diffusing film 350 is directly produced on one side surface of the second package substrate 330, which enables the integration of the uniform-light diffusing film 350. By doing so, after the package of the quantum dot functional layer 310 by the first package substrate 320 and the second package substrate 330, it is possible to realize the integration of at least one of the prism structure 340 and the uniform-light diffusing film 350 and the quantum dot film 300. In contrast, in the technical solution of the related art, the prism sheet and the diffusing sheet are separately arranged on upper and lower layers of the quantum dot film 300, respectively, and the prism sheet and the diffusing sheet each require a separate substrate, and the structure formed by these components and two layers of package substrates on the quantum dot film is thus complicated and has a large modular thickness. However, the optical device obtained by the method provided in the embodiment of the present disclosure can lead to the omission of the base substrate of at least one of the prism sheet and the diffusing sheet, thereby simplifying the structure of the optical device and reducing the modular thickness of the optical device.

In the above step S1, the forming the prism structure 340 on the first side surface of the first package substrate 320 with the first package substrate 320 as the base substrate specifically includes: forming the prism structure 340 on the first side surface of the first package substrate 320 with the first package substrate 320 as a base substrate through a rolling method.

In the above step S1, the forming the uniform-light diffusing film 350 on the third side surface of the second package substrate 330 with the second package substrate 330 as a base substrate specifically includes: plating reflective films on the third side surface of the second package substrate 330 at positions corresponding to the plurality of reflective regions 351 of the transflective film by an ion beam sputter coating method, to form the transflective film.

Further, optionally, prior to the step S2, the method further includes: forming a first isolation protective layer 360 on the second side surface of the first package substrate 320; and forming a second isolation protective layer 370 on the fourth side surface of the second package substrate 330.

Both the first isolation protective layer 360 and the second isolation protective layer 370 may be formed by the ion beam sputter coating method, and the thicknesses of the first isolation protective layer 360 and the second isolation protective layer 370 may be reasonably designed depending on the thickness of the quantum dot functional layer 310.

In the above solution, first, the prism structure 340 is formed on the first side surface of the first package substrate 320 to enable the integration of the prism structure 340 with the first package substrate 320 and the enhancement of the light efficiency, and the first isolation protective layer 360 is formed on the second side surface to achieve isolation and protection of the quantum dot functional layer 310; the transflective film is formed on the third side surface of the second package substrate 330 for the purpose of integrating the transflective film on the second package substrate 330, and the second isolation protective layer 370 is provided on the fourth side surface to achieve isolation and protection of the quantum dot functional layer 310. Then, the first package substrate 320 is bonded with the second package substrate 330 by applying the quantum dot functional layer 310 therebetween, which contains glue and needs to be cured to form the quantum dot film 300.

In addition, optionally, the step S3 of the method specifically includes: forming a white-light-highly-reflective layer 110 on a region of the first face of the chip substrate 100, on which none of the plurality of light-emitting chips 200 is arranged.

The white-light-highly-reflective layer 110 may be formed on the chip substrate 100 using an ion beam sputter coating method.

The white-light-highly-reflective layer 110 may adopt a multilayer composite film layer of a tantalum pentoxide ($Ta_2O_5$) film layer and a silicon dioxide ($SiO_2$) film layer, which composite film layer may optionally have a thickness from 5 to 6 micrometers; or alternatively, the white-light-highly-reflective layer 110 may also be a silver plated film or an aluminum plated film, which may optionally have a thickness from 0.2 to 0.3 micrometers. The white-light-highly-reflective layer 110 may be formed by ion beam sputter coating in the process. Of course, it will be understood that, in practical applications, the white-light-highly-reflective layer 110 may also adopt other reflective films having a reflectivity for white light greater than a preset value.

In addition, in another aspect, embodiments of the present disclosure provide a display device including the optical device provided by the embodiments of the present disclosure as described above.

In the above solution, the first package substrate of the quantum dot film serves as the base substrate of the prism structure and the prism structure is directly produced on one side surface of the first package substrate, which enables the integration of the prism structure and the quantum dot film; and/or, the second package substrate of the quantum dot film serves as the base substrate of the uniform-light diffusing film and the uniform-light diffusing film is directly produced on one side surface of the second package substrate, which enables the integration of the uniform-light diffusing film. By doing so, after the package of the quantum dot functional layer by the first package substrate and the second package substrate, it is possible to realize the integration of at least one of the prism structure and the uniform-light diffusing film and the quantum dot film. As compared to the technical solution of the related art, in which the prism sheet and the diffusing sheet are separately arranged on upper and lower layers of the quantum dot film, respectively, the technical solutions of the present disclosure are capable of simplifying the structure of the optical device and reducing the modular thickness of the optical device.

The above are merely optional embodiments of the present disclosure, and it should be indicated that those skilled in the art can also make several improvements and modifications, which also fall within the scope of protection of the present disclosure, without departing from the principles of the present disclosure.

What is claimed is:

1. An optical device, comprising:
  a chip substrate having a first face on which a plurality of light-emitting chips for emitting blue light is distributed in an array; and
  a quantum dot film arranged on a side of the chip substrate where the first face is located and configured to convert the blue light emitted by the plurality of light-emitting chips into monochromatic light in various colors capable of being mixed into white light,
  wherein the quantum dot film comprises:
  a quantum dot functional layer,
  a first package substrate arranged on a side of the quantum dot functional layer away from the chip substrate and comprising a first side surface away from the quantum dot functional layer and a second side surface arranged opposite to the first side surface, and a second package substrate arranged on a side of the quantum dot functional layer proximate to the chip substrate, and comprising a third side surface away from the quantum dot functional layer and a fourth side surface arranged opposite to the third side surface, and wherein the quantum dot film further comprises:

a prism structure integrated on the first side surface of the first package substrate with the first package substrate as a base substrate; and a uniform-light diffusing film integrated on the third side surface of the second package substrate with the second package substrate as a base substrate.

2. The optical device of claim 1, wherein the quantum dot film further comprises:

a first isolation protective layer arranged on the second side surface of the first package substrate; and a second isolation protective layer arranged on the fourth side surface of the second package substrate.

3. The optical device of claim 1, wherein the uniform-light diffusing film comprises a transflective film, comprising:

a plurality of reflective regions configured to reflect the blue light; and a transmissive region configured allow the blue light to pass therethrough, wherein the plurality of reflective regions is distributed in an array on the second package substrate, and orthogonal projections of the plurality of reflective regions on the first face of the chip substrate the plurality of light-emitting chips, respectively.

4. The optical device of claim 1, wherein a highly-reflective layer is arranged on a region of the first face of the chip substrate, on which none of the plurality of light-emitting chips is arranged.

5. The optical device of claim 4, wherein the highly-reflective layer is a white-light-highly-reflective layer having a reflectivity for white light greater than a preset value.

6. The optical device of claim 5, wherein the white-light-highly-reflective layer comprises a composite film layer of a tantalum pentoxide film layer and a silicon dioxide film layer, a silver plated film layer or an aluminum plated film layer.

7. A method for manufacturing an optical device, comprising:

providing a first package substrate comprising a first side surface and a second side surface arranged opposite to each other and a second package substrate comprising a third side surface and a fourth side surface disposed opposite to each other;

bonding the second side surface of the first package substrate and the fourth side surface of the second package substrate by applying a quantum dot functional layer between the first package substrate and the second package substrate to form a quantum dot film after the quantum dot functional layer has been cured;

forming a chip substrate having a first face on which a plurality of light-emitting chips for emitting blue light is distributed in an array; and arranging the quantum dot film on a side of the chip substrate where the first face is located, wherein the providing the first package substrate and the second package substrate comprises:

forming a prism structure on the first side surface of the first package substrate with the first package substrate as a base substrate, and forming a uniform-light diffusing film on the third side surface of the second package substrate with the second package substrate as a base substrate.

8. The method of claim 7, wherein the uniform-light diffusing film comprises a transflective film that comprises:

a plurality of reflective regions configured to reflect the blue light; and a transmissive region configured to allow the blue light to pass therethrough, wherein the plurality of reflective regions is distributed in an array on the second package substrate, and orthogonal projections of the plurality of reflective regions on the first face of the chip substrate completely coincide with the plurality of light-emitting chips, respectively.

9. The method of claim 7, wherein the forming the prism structure on the first side surface of the first package substrate with the first package substrate as the base substrate comprises:

forming the prism structure on the first side surface of the first package substrate with the first package substrate as the base substrate through a rolling method.

10. The method of claim 8, wherein the forming the uniform-light diffusing film on the third side surface of the second package substrate with the second package substrate as the base substrate comprises:

plating reflective films on the third side surface of the second package substrate at positions corresponding to the plurality of reflective regions of the transflective film by an ion beam sputter coating method, to form the transflective film.

11. The method of claim 7, wherein prior to bonding the second side surface of the first package substrate and the fourth side surface of the second package substrate, the method further comprises:

forming a first isolation protective layer on the second side surface of the first package substrate by an ion beam sputter coating method; and forming a second isolation protective layer on the fourth side surface of the second package substrate by an ion beam sputter coating method.

12. The method of claim 7, wherein the forming the chip substrate comprises:

forming a highly-reflective layer on a region of the first face of the chip substrate, on which none of the plurality of light-emitting chips is arranged.

13. The method of claim 10, wherein the highly-reflective layer is a white-light-highly-reflective layer having a reflectivity for white light greater than a preset value.

14. The method of claim 13, wherein the white-light-highly-reflective layer comprises a composite film layer of a tantalum pentoxide film layer and a silicon dioxide film layer, a silver plated film layer or an aluminum plated film layer.

15. A display device comprising the optical device of claim 1.

16. The display device of claim 15, wherein the quantum dot film further comprises:

a first isolation protective layer arranged on the second side surface of the first package substrate; and a second isolation protective layer arranged on the fourth side surface of the second package substrate.

17. The display device of claim 15, wherein the uniform-light diffusing film comprises a transflective film that comprises:

a plurality of reflective regions configured to reflect the blue light; and a transmissive region configured to allow the blue light to pass therethrough, wherein the plurality of reflective regions is distributed in an array on the second package substrate, and orthogonal projections of the plurality of reflective regions on the first face of the chip substrate completely coincide with the plurality of light-emitting chips, respectively.

18. The display device of claim 15, wherein a highly-reflective layer is arranged on a region of the first face of the chip substrate, on which none of the plurality of light-emitting chips is arranged.

19. The display device of claim 18, wherein the highly-reflective layer is a white-light-highly-reflective layer having a reflectivity for white light greater than a preset value.

20. The display device of claim 19, wherein the white-light-highly-reflective layer comprises a composite film layer of a tantalum pentoxide film layer and a silicon dioxide film layer, a silver plated film layer or an aluminum plated film layer.

* * * * *

UNITED STATES PATENT AND TRADEMARK OFFICE
CERTIFICATE OF CORRECTION

Page 1 of 1

PATENT NO. : 10,767,833 B2
APPLICATION NO. : 16/390430
DATED : September 8, 2020
INVENTOR(S) : Bing Zhang et al.

It is certified that error appears in the above-identified patent and that said Letters Patent is hereby corrected as shown below:

On the Title Page

Item (73) Delete:
"(73) Assignees: HEFEI BOE OPTOELECTRONICS TECHNOLOGY CO, LTD., Hefei, Anhui (CN); BOE TECHNOLOGY GROUP CO., LTD., Beijing (CN)"

And Insert:
--(73) Assignees: HEFEI BOE OPTOELECTRONICS TECHNOLOGY CO., LTD., Hefei, Anhui (CN); BOE TECHNOLOGY GROUP CO., LTD., Beijing (CN)--.

Signed and Sealed this
First Day of June, 2021

Drew Hirshfeld
*Performing the Functions and Duties of the*
*Under Secretary of Commerce for Intellectual Property and*
*Director of the United States Patent and Trademark Office*